United States Patent
Lin et al.

(10) Patent No.: US 9,543,482 B2
(45) Date of Patent: Jan. 10, 2017

(54) LED PACKAGE

(71) Applicant: ADVANCED OPTOELECTRONIC TECHNOLOGY, INC., Hsinchu Hsien (TW)

(72) Inventors: Hou-Te Lin, Hsinchu (TW); Chao-Hsiung Chang, Hsinchu (TW); Pin-Chuan Chen, Hsinchu (TW); Lung-Hsin Chen, Hsinchu (TW)

(73) Assignee: ADVANCED OPTOELECTRONIC TECHNOLOGY, INC., Hsinchu Hsien (TW)

(*) Notice: Subject to any disclaimer, the term of this patent is extended or adjusted under 35 U.S.C. 154(b) by 0 days.

(21) Appl. No.: 14/523,425

(22) Filed: Oct. 24, 2014

(65) Prior Publication Data

US 2015/0179902 A1 Jun. 25, 2015

(30) Foreign Application Priority Data

Dec. 24, 2013 (CN) .......................... 2013 1 0718045

(51) Int. Cl.
*H01L 33/20* (2010.01)
*H01L 33/38* (2010.01)
*H01L 33/50* (2010.01)
*H01L 33/54* (2010.01)

(52) U.S. Cl.
CPC .......... *H01L 33/507* (2013.01); *H01L 33/505* (2013.01)

(58) Field of Classification Search
CPC .................................................. H01L 33/505
USPC ......................................................... 257/98
See application file for complete search history.

(56) References Cited

U.S. PATENT DOCUMENTS

| | | | | |
|---|---|---|---|---|
| 2007/0228947 | A1* | 10/2007 | Tanimoto et al. | 313/506 |
| 2008/0093614 | A1* | 4/2008 | Nagai | F21K 9/00 257/98 |
| 2008/0315228 | A1* | 12/2008 | Krames | H01L 33/46 257/98 |
| 2010/0051984 | A1* | 3/2010 | West | H01L 33/44 257/98 |
| 2010/0200870 | A1* | 8/2010 | Shen | H01L 33/44 257/88 |
| 2012/0319148 | A1* | 12/2012 | Donofrio | H01L 33/54 257/98 |
| 2013/0240915 | A1* | 9/2013 | Nakagawa et al. | 257/88 |
| 2014/0167598 | A1* | 6/2014 | Chen et al. | 313/498 |
| 2015/0069439 | A1* | 3/2015 | Deeben et al. | 257/98 |
| 2015/0118773 | A1* | 4/2015 | Kojima | C09K 11/02 438/29 |

FOREIGN PATENT DOCUMENTS

TW      201104914 A      2/2011

* cited by examiner

*Primary Examiner* — Moazzam Hossain
(74) *Attorney, Agent, or Firm* — Zhigang Ma

(57) ABSTRACT

The present invention is related to a light emitting diode (LED) package. The LED package includes a blue LED chip, a first electrode, a second electrode and a phosphor layer. The phosphor layer covers an outer periphery of the blue LED chip, except a bottom surface of the blue LED chip. The phosphor layer is mixed by yellow fluorescent powder and glue. The phosphor layer includes a main portion corresponding to a central portion of an emitting angle of the blue LED chip and an extending portion corresponding to a periphery of the emitting angle. An average thickness of the main portion is larger than the thickness of the extending portion.

9 Claims, 4 Drawing Sheets

LED PACKAGE

CROSS-REFERENCE TO RELATED APPLICATIONS

This application claims priority to Chinese Patent Application No. 201310718045.8 filed on Dec. 24, 2013 in the China Intellectual property Office, the contents of which are incorporated by reference herein.

FIELD

The disclosure relates to a light emitting diode (LED) package.

BACKGROUND

An LED package typically includes a blue LED chip, an phosphor layer and an packaging layer encapsulating the LED chip therein in series. A thickness of the phosphor layer is uniform.

BRIEF DESCRIPTION OF THE DRAWINGS

Implementations of the present technology will now be described, by way of example only, with reference to the attached figures.

DETAILED DESCRIPTION OF EMBODIMENTS

It will be appreciated that for simplicity and clarity of illustration, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure. The description is not to be considered as limiting the scope of the embodiments described herein.

A definition that applies throughout this disclosure will now be presented. The term "comprising" means "including, but not necessarily limited to"; it specifically indicates open-ended inclusion or membership in a so-described combination, group, series and the like.

Figure 1:
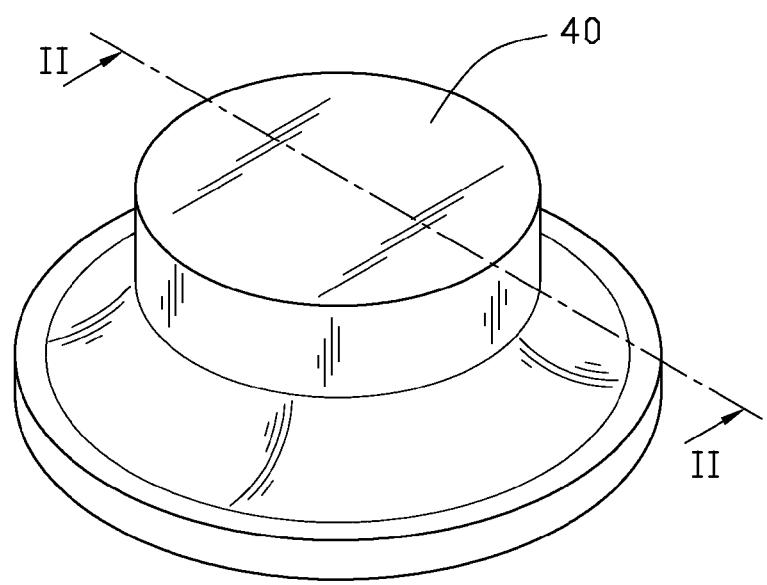
FIG. 1 is a isometric view of an LED package in accordance with a first embodiment of the present disclosure.
Figure 2:
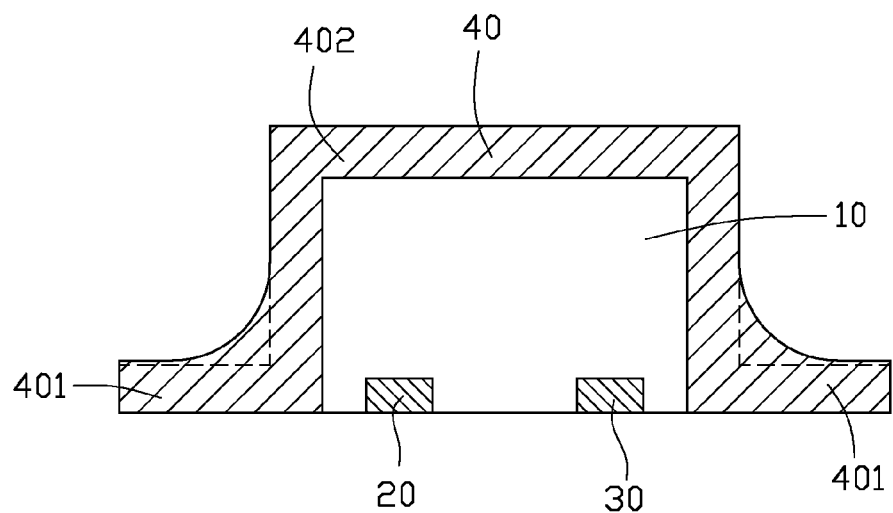
FIG. 2 is a cross sectional view of an LED package in accordance with a first embodiment of the present disclosure.

Referring to FIG. 1 and FIG. 2, an LED package of a first embodiment includes a blue LED chip 10, a first electrode 20 and a second electrode 30 arranged in a bottom of the blue LED chip 10 and a phosphor layer 40 covering the periphery of the blue LED chip 10.

The longitudinal section of the blue LED chip 10 is rectangular.

The first electrode 20 and the second electrode 30 are arranged in two sides of the bottom of the blue LED chip 10, and are used to electronically couple the LED chip 10 to an external power source. The first electrode 20 and the second electrode 30 are exposed from, and do not contact, the phosphor layer 40.

The phosphor layer 40 covers an outer periphery of the blue LED chip 10, except a bottom surface of the blue LED chip 10. The phosphor layer 40 is mixed by yellow fluorescent powder and glue. The phosphor layer 40 includes a main portion 402 corresponding to a central portion of an emitting angle of the blue LED chip 10 and an extending portion 401 corresponding to a periphery of the emitting angle of the blue LED chip 10 and extending from a bottom end of the main portion 402. The main portion 402 is arranged on a top surface of the blue LED chip 10 and an upper end of a lateral surface of the blue LED chip 10. The extending portion 401 is arranged on an bottom end of the lateral surface of the blue LED chip 10. The thickness of the main portion 402 is uniform. The average thickness of the extending portion 401 is larger than the thickness of the main portion 402.

In this embodiment, the longitudinal section of the main portion 402 is U-shaped, and the longitudinal section of the extending portion 401 is L-shaped. In other embodiment, the longitudinal section of the extending portion 401 can be changed.

Specifically, the extending portion 401 extends from the bottom end of the main portion 402 and a thickness thereof is gradually increasing from a top end connected to the main portion 402 to a bottom end away from the main portion 402. The bottom surface of the extending portion 401 and a bottom surface of the blue LED chip 10 are planar.

Figure 3:
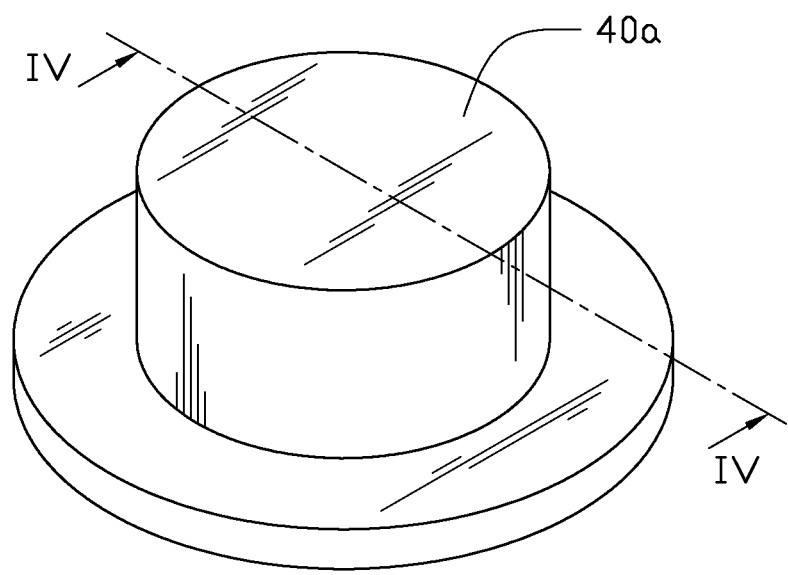
FIG. 3 is a isometric view of an LED package in accordance with a second embodiment of the present disclosure.
Figure 4:
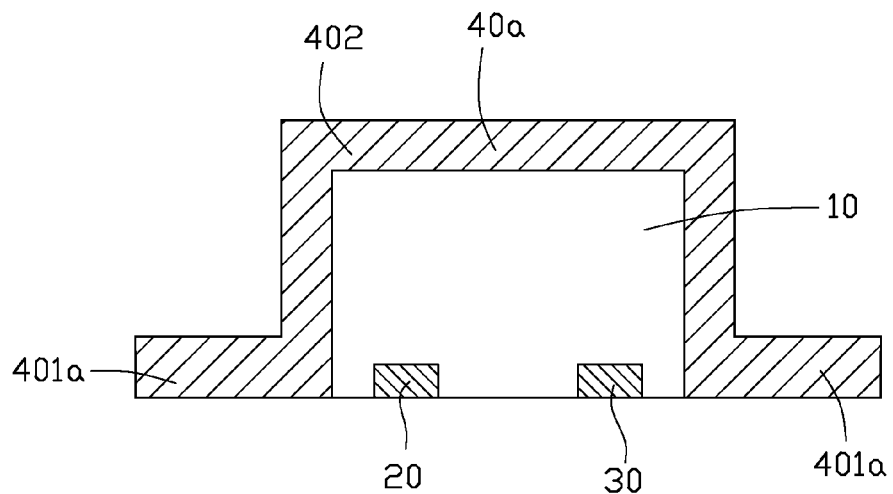
FIG. 4 is a cross sectional view of an LED package in accordance with a second embodiment of the present disclosure.

Referring to the FIG. 3 and FIG. 4, an LED package of a second embodiment is similar to that of the first embodiment. The LED package includes a phosphor layer 40a, the phosphor layer 40a includes a main portion 402 and an extending portion 401a extending from the main portion 402. The extending portion 401a extends vertically from the bottom end the main portion 402. A thickness of the extending portion 401a is uniform and larger than that of the main portion 402.

While the LED chip 10 is working, most light emitted from the blue LED chip 10 radiates towards the main portion 402 to cause the main portion 402 to be florescent. Additionally, the light radiates towards the extending portion 401 as well causing the extending portion 401 and 401a to be fluorescent.

It is to be further understood that even though numerous characteristics and advantages have been set forth in the foregoing description of embodiments, together with details of the structures and functions of the embodiments, the disclosure is illustrative only; and that changes may be made in the details, including in matters of shape, size, and arrangement of parts within the principles of the disclosure to the full extent indicated by the broad general meaning of the terms in which the appended claims are expressed.

The embodiments shown and described above are only examples. Many details are often found in the art such as the other features of an LED package. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A light emitting diode (LED) package comprising:
   a blue LED chip, the blue LED chip comprising a top surface, a bottom surface opposite to the top surface, and a sidewall surface perpendicular to the top surface and bottom surface, the longitudinal section of the blue LED chip is rectangular;
   a first electrode and a second electrode; and
   a phosphor layer, the phosphor layer covering an outer periphery of the top surface and sidewall surface of the blue LED chip, wherein the phosphor layer comprises a mixture of yellow fluorescent powder and glue;
   wherein the phosphor layer includes a main portion corresponding to the top surface of the blue LED chip and an extended portion corresponding to the sidewall surface of the blue LED chip and extending perpendicularly away from the bottom of each sidewall surface of the blue LED chip to define a periphery of the extended portion, wherein an outer surface of the extended portion connected between the main portion and the periphery of the extended portion forms a concave surface adjacent to the sidewall surface of the blue LED chip with an arc-shaped cross-section, wherein at an end adjacent to the main portion, the concave surface intersects at a substantially perpendicular angle to the main portion, and wherein at the other end corresponding to the periphery of the extended portion, the concave surface extends along a substantially perpendicular direction from the sidewall surface of the blue LED chip, wherein the average thickness of the extended portion along the periphery of the extended portion is greater than the thickness of the main portion.

2. The LED package of claim 1, wherein the thickness of the main portion is uniform.

3. The LED package of claim 2, wherein the extended portion bends along the sidewall surface of the blue LED chip.

4. The LED package of claim 3, wherein a thickness of the extended portion gradually increases from a top end connected to the main portion to a bottom end away from the main portion.

5. The LED package of claim 3, wherein the longitudinal section of the main portion is U-shaped.

6. The LED package of claim 3, wherein the longitudinal section of the extended portion is L-shaped.

7. The LED package of claim 1, wherein a first electrode and a second electrode are arranged in two sides of the bottom the blue LED chip.

8. The LED package of claim 1, wherein the first electrode and the second electrode are spaced from the extended portion of the phosphor layer.

9. The LED package of claim 1, wherein top ends of the first electrode and the second electrode are lower than an top periphery of the extended portion.

* * * * *